(12) United States Patent
Ou

(10) Patent No.: US 7,863,940 B2
(45) Date of Patent: Jan. 4, 2011

(54) ENVELOPE DETECTOR FOR HIGH SPEED APPLICATIONS

(75) Inventor: Chiung-Ting Ou, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 103 days.

(21) Appl. No.: 12/192,803

(22) Filed: Aug. 15, 2008

(65) Prior Publication Data

US 2010/0039141 A1  Feb. 18, 2010

(51) Int. Cl.
*H03K 5/153* (2006.01)
(52) U.S. Cl. .............................. 327/62; 327/58; 327/59; 327/60; 327/61; 327/66; 327/67; 327/551
(58) Field of Classification Search .................. 327/62, 327/551
See application file for complete search history.

(56) References Cited

U.S. PATENT DOCUMENTS 7,053,674 B1 * 5/2006 Romero et al. ................ 327/94

7,218,903 B2 * 5/2007 Komatsu et al. ............ 455/218

OTHER PUBLICATIONS

Savoj, J., et al., "A 3.125-Gb/s Sub-Milliwatt CMOS Signal Detector Circuit," 2005 Symposium on VLSI Circuits Digest of Technical Papers, pp. 198-201.
Sugawara, M., et al., "1.5 Gbps, 5150 ppm Spread Spectrum SerDes PHY with a 0.3 mW, 1.5 Gbps Level Detector for Serial ATA," 2002 Symposium On VLSI Circuits Digest of Technical Papers, pp. 60-63.

* cited by examiner

*Primary Examiner*—Lincoln Donovan
*Assistant Examiner*—John W Poos
(74) *Attorney, Agent, or Firm*—Slater & Matsil, L.L.P.

(57) ABSTRACT

An envelope detecting circuit is provided. The envelope detecting circuit comprises a source degeneration circuit that amplifies an input differential signal, a differential gain stage that supplies a voltage proportional to the amplified signal, a potential hold circuit that holds the voltage supplied from the gain stage, a comparator circuit that compares the voltage held by the potential holding circuit with a reference potential to output a detect signal, and envelope level adjustment and selection unit that responds to the detect signal and outputs a control signal to the source degeneration circuit.

20 Claims, 14 Drawing Sheets

Schmitt trigger comparator

If $V(vin) > V(vref)$, $vout = 1$
If $V(vin) < V(vref)$, $vout = 0$

ENVELOPE DETECTOR FOR HIGH SPEED APPLICATIONS

TECHNICAL FIELD

The present invention relates generally to electronic signal processing circuits, and more particularly to an envelope detector for high-speed serial applications.

BACKGROUND

Serial interfaces are widely employed in digital applications to send and receive digital data between different components of a digital system. As a typical example, various serial interface standards, such as USB2.0, serial ATA and PCI express, have been adopted to provide wireline chip-to-chip communication between modules in a personal computer. While the trend of developing larger, faster, more complex digital system continues, e.g., multi-medium personal computers capable of processing larger amount to digital data in real time, serial interface technology is quickly evolving to cope with the trend. As a consequence, serial interfaces adopted in advanced digital system generally should exhibit the following desirable characteristics: higher processing speed, processing digital signals with reduced signal amplitudes, increased noise tolerance, reduced power consumption, dynamic adjustment of input bandwidth, and dynamic adjustment of envelope level, among others.

FIG. 1 is a system diagram illustrating a conventional envelope detecting circuit provided in an existing serial interface for detecting digital signals in a chip-to-chip communication channel. Digital signals transmitted through the communication channel are generally in the form of signal packets modulated on a carrier frequency. The packets are detected from the communication channel through the potential difference between input differential signals Vin+ and Vin−. For example, when the potential difference between Vin+ and Vin− is below a pre-determined offset reference value, the communication channel is in a non-signal state; when the difference between Vin+ and Vin− is above the pre-determined offset reference value, the communication channel is in a signal state. A signal packet is identified by the envelope detecting circuit, which proceeds to process and extract the desired envelope signal from the packet.

The envelope detecting circuit includes a first differential operational amplifier that receives input differential signals Vin+ and Vin− and amplifies the positive-side magnitude of an incoming waveform and outputs to a gain stage. The envelope detecting circuit also includes a second differential operational amplifier that receives input differential signals Vin+ and Vin− and amplifies the negative-side magnitude of an incoming waveform and outputs to a gain stage. A potential hold circuit holds the potential from the gain stages. A comparator circuit compares the potential held by the potential hold circuit with the pre-determined offset reference value to decide whether there is a signal or non-signal state and outputs the result as a detect signal.

While high-speed signal transfer in an advanced digital system becomes increasingly important, the operation of the conventional envelope detecting circuit described above is problematic in a number of ways. First, the conventional envelope detecting circuit requires multiple operational amplifiers and consumes significant power. Furthermore, the plural operational amplifiers presented at the front stage of a conventional envelope detecting circuit exhibit a large input capacitance load, which generally limits the speed of signal receiving and sending. In addition, the conventional envelope detecting circuit lacks the capability of input signal bandwidth selection and dynamic envelope level tuning, which would be desirable in advanced high-speed digital system.

SUMMARY OF THE INVENTION

These and other problems are generally solved or circumvented, and technical advantages are generally achieved, by preferred embodiments of the present invention which provide an envelope detecting circuit. The envelope detecting circuit comprises a source degeneration circuit that amplifies an input differential signal, a differential gain stage that supplies a voltage proportional to the amplified signal, a potential hold circuit that holds the voltage supplied from the gain stage, a comparator circuit that compares the voltage held by the potential holding circuit with a reference potential to output a detect signal, and envelope level adjustment and selection unit that responds to the detect signal and outputs a control signal to the source degeneration circuit.

In accordance with a preferred embodiment of the present invention, an envelope detecting circuit comprises a source degeneration circuit that amplifies differential input signals to output an amplified signal, a gain stage that receives the amplified signal and supplies a voltage proportional to the amplified signal, a potential holding circuit that holds the voltage supplied from the gain stage, a comparator circuit that compares the voltage held by the potential holding circuit and a reference potential to output a detect signal, and an envelope level adjustment and selection unit that operates on the detect signal and outputs a control signal to the source degeneration circuit to control a level of the envelope.

In accordance with another preferred embodiment of the present invention, an envelope detecting circuit comprises a first differential operational amplifier that amplifies differential input signals to output an amplified signal, a second differential operational amplifier that supplies a single-end voltage proportional to the amplified signal, a potential holding circuit that holds the voltage supplied from the second differential operational amplifier, a comparator circuit that compares the voltage held by the potential holding circuit and a reference potential to output a detect signal, and an envelope level adjustment and selection unit that operates on the detect signal and outputs a control signal to the first differential operational amplifier; wherein the control signal provides dynamic envelope level control.

In accordance with a further preferred embodiment of the present invention, an envelope detecting circuit comprises a source degeneration circuit that amplifies differential input signals to output differential output signals, a gain stage that amplifies the output differential output signals from the source degeneration circuit and outputs a single-end amplified signal, a potential holding circuit that holds the potential of the single-end amplified signal supplied from the gain stage, a comparator circuit that receives the potential held by the potential holding circuit and compares the potential held by the potential holding circuit with a reference potential, and outputs a detect signal, and an envelope level adjustment and selection unit that operates on the detect signal and an initial selection and offset calibration signal from a constant voltage, and outputs a control signal to the source degeneration circuit to control a level of the envelope.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an envelope detector for high speed serial applications. Embodiments of the present invention may provide higher signal processing speed with a transfer rate of greater than 5 Gbps. The preferred embodiments also may exhibit increased noise tolerance, and thus be capable of processing digital signals with reduced signal amplitudes. In contrast with a conventional envelope detector, the number of operational amplifiers required to operate the envelope detector in preferred embodiments is reduced, thus consuming much less power. Moreover, the envelope detector in preferred embodiments facilitates dynamic adjustment of input bandwidth and dynamic adjustment of envelope level, and thus is more suitable as high speed serial interface for advanced digital system.

Figure 1:
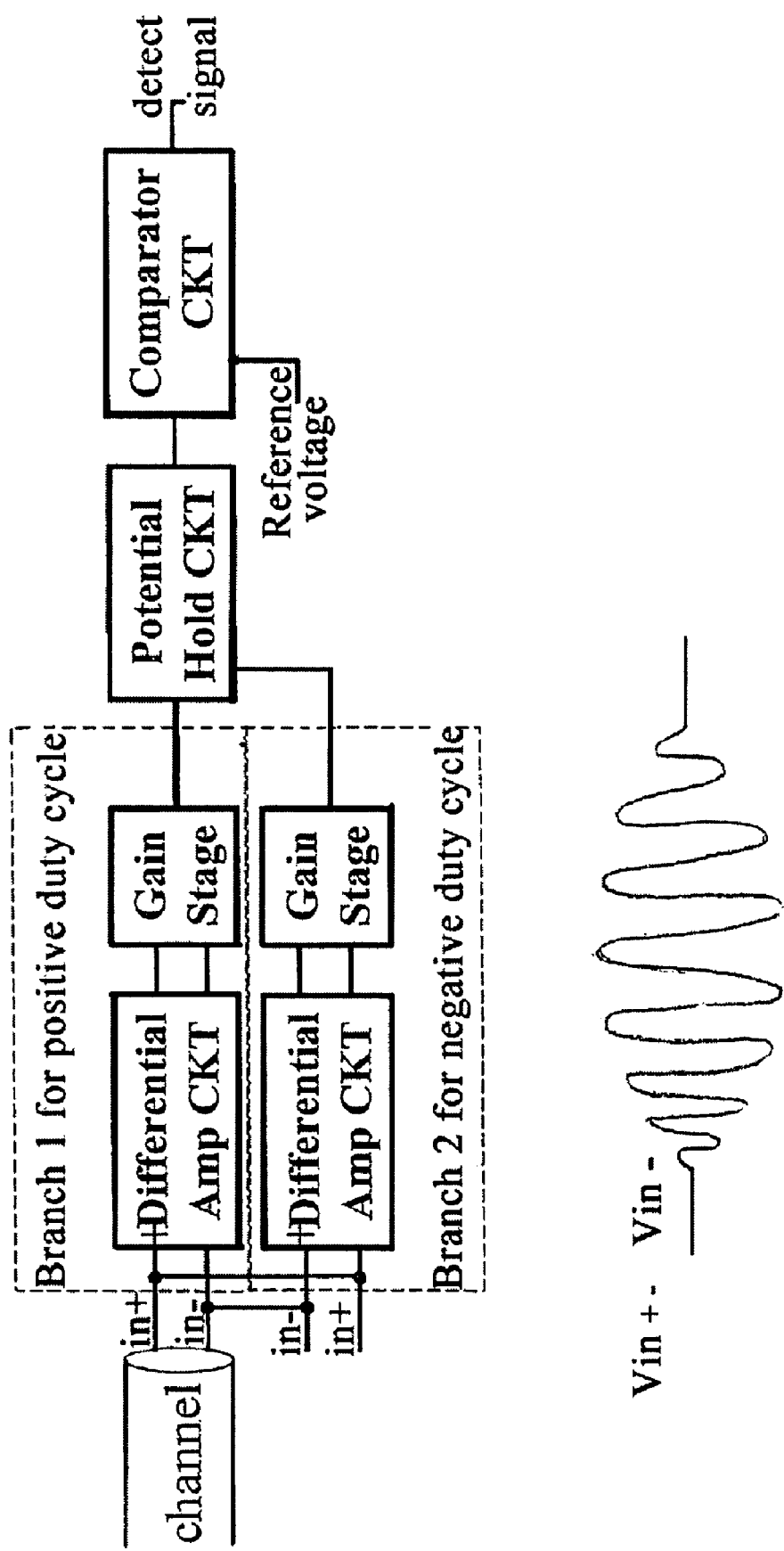
FIG. 1 illustrates a block diagram and a input differential signal of a prior art envelope detecting circuit.
Figure 2:
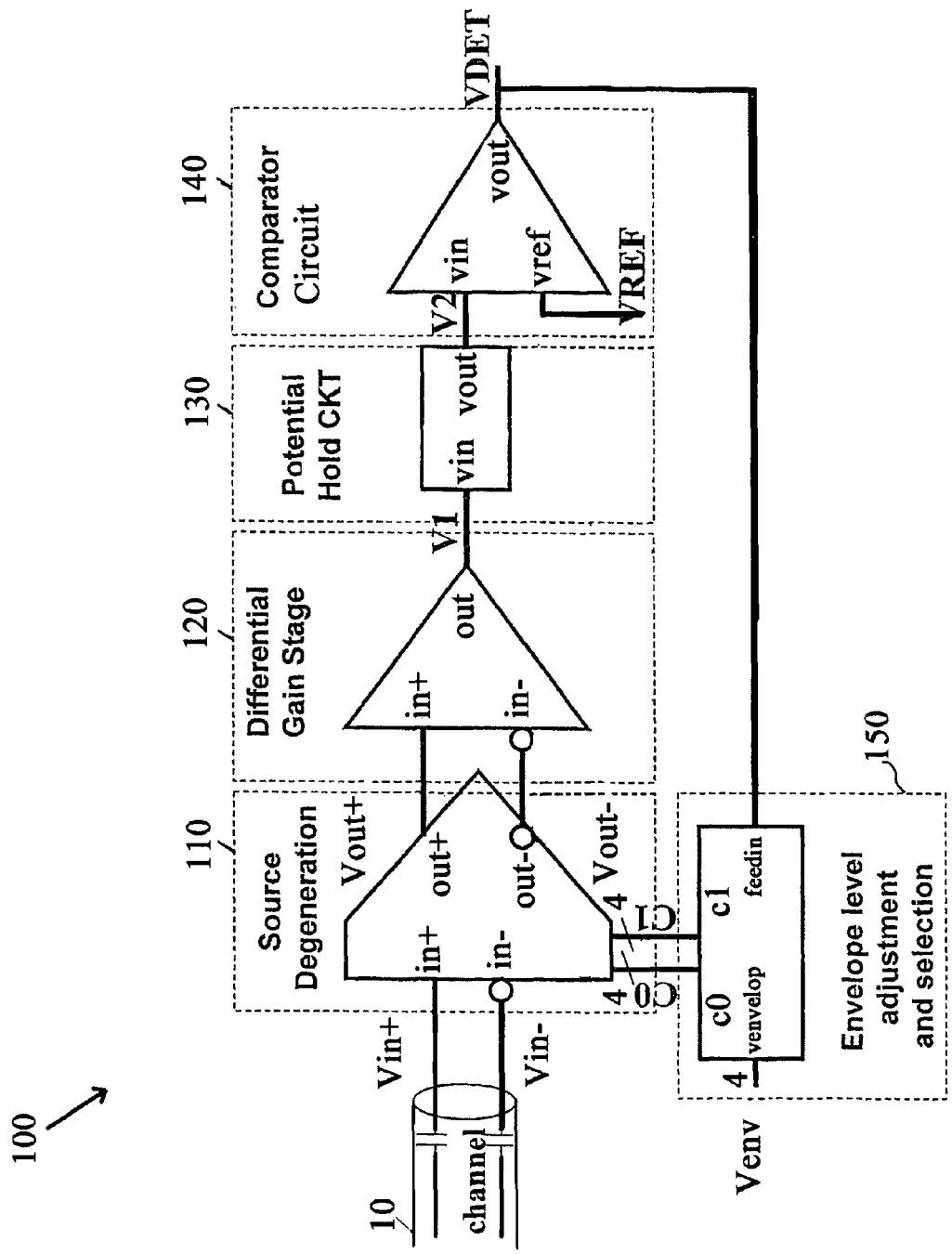
FIG. 2 is a block diagram of an envelope detector of an illustrative embodiment.

FIG. 2 illustrates a block diagram of envelope detector 100 according to one preferred embodiment of the current invention. Envelope detector 100 comprises source degeneration unit 110, differential gain stage 120, potential hold circuit 130, comparator circuit 140, and envelope level adjustment and selection unit 150. In operation, input signals Vin+ and Vin− from communication channel 10 are inputted to source degeneration unit 110. In one preferred embodiment, communication channel 10 is a bidirectional, serial peripheral bus that transmits a single bit of data at a time at high frequencies, and input differential signals Vin+ and Vin− each have an amplitude of from −100 mV to +100 mV. Differential signals (Vin+)-(Vin−) inputted to source degeneration unit 110 are amplified and the outputted signals Vout+ and Vout− are supplied to differential gain stage 120. The amplified signal V1 is subsequently supplied to potential hold circuit 130. Potential hold circuit 130 holds the potential V1 from gain stage 120 and outputs a potential V2 that is proportional to V1. Comparator circuit 140 compares V2 with a pre-determined reference potential Vref to decide whether it indicates a signal state or a non-signal state, and outputs a signal Vdet as a detect signal. Furthermore, detect signal Vdet is fed back into envelope level adjustment and selection unit 150. Envelope level adjustment and selection unit 150 operates on Vdet and a pre-determined system initial selection and offset calibration signal (envelope level signal) Venv, and outputs control signals C0 and C1, which are supplied to source degeneration unit 110. Envelope level adjustment and selection unit 150 operates as follows: when a signal is detected (Vdet is high), C0 will increase and C1 will decrease so that the offset value between Vout+ and Vout− is decreased; when non-signal is detected (Vdet is low), C1 will increase and C0 will decrease so that the offset value between Vout+ and Vout− is increased to a value substantially equal to the pre-determined system initial selection and offset calibration signal Venv. It is noted that, in the current embodiment, signals C0, C1, and Venv may each comprise four-bit digital buses to achieve a desired control precision, as indicated in FIG. 2. Eight-bit digital buses are used for C0 and C1 in other embodiments where higher precision control is needed.

Figure 3:
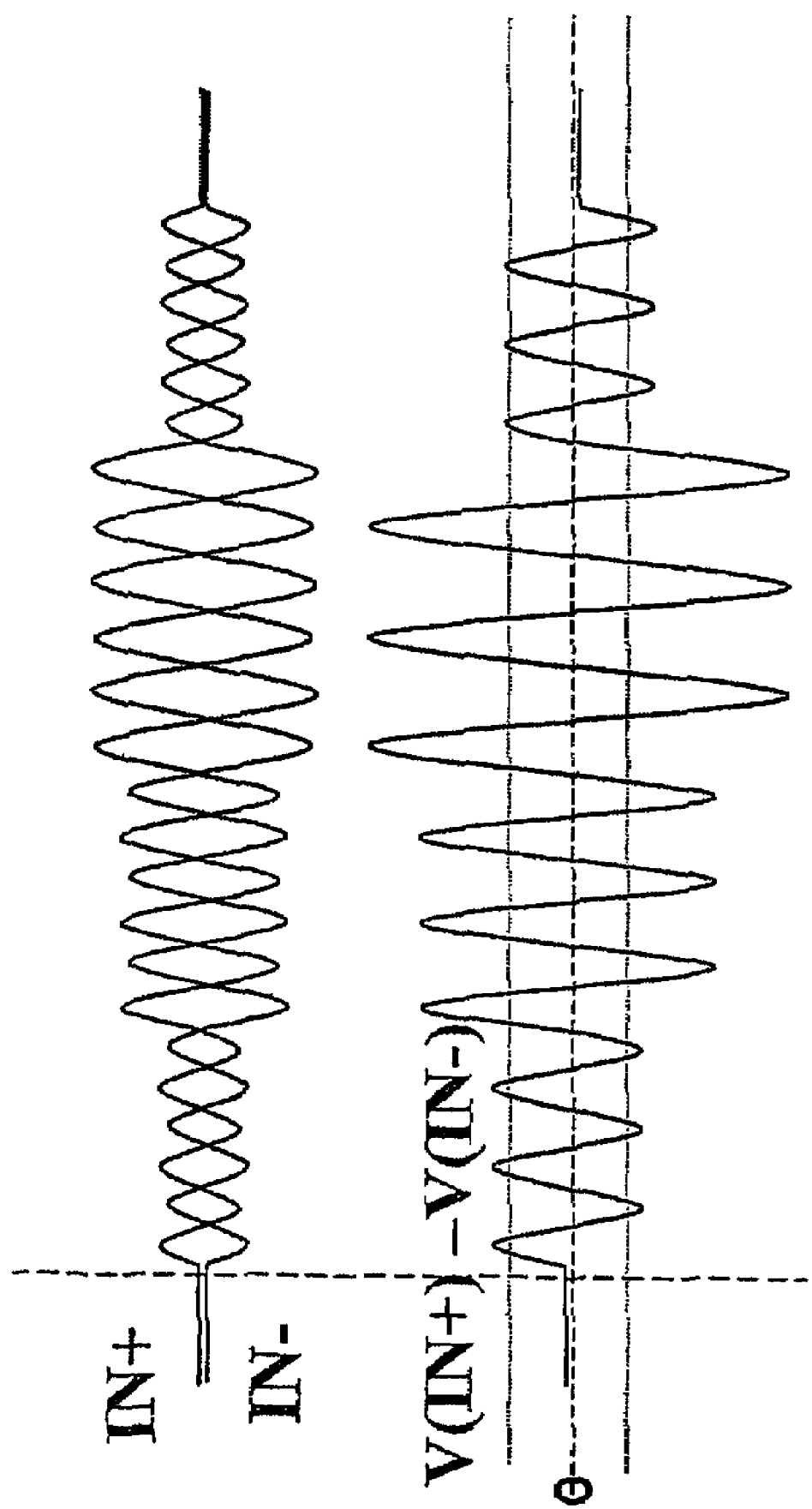
FIG. 3 illustrates signal waveforms of an input signals Vin+, Vin−, and the differential signal (Vin+)-(Vin−) of an illustrative embodiment.

FIG. 3 shows the signal waveforms of input signals Vin+, Vin−, and the differential signal (Vin+)-(Vin−) at the input stage of envelope detector 100.

Figures 4A, 4C:
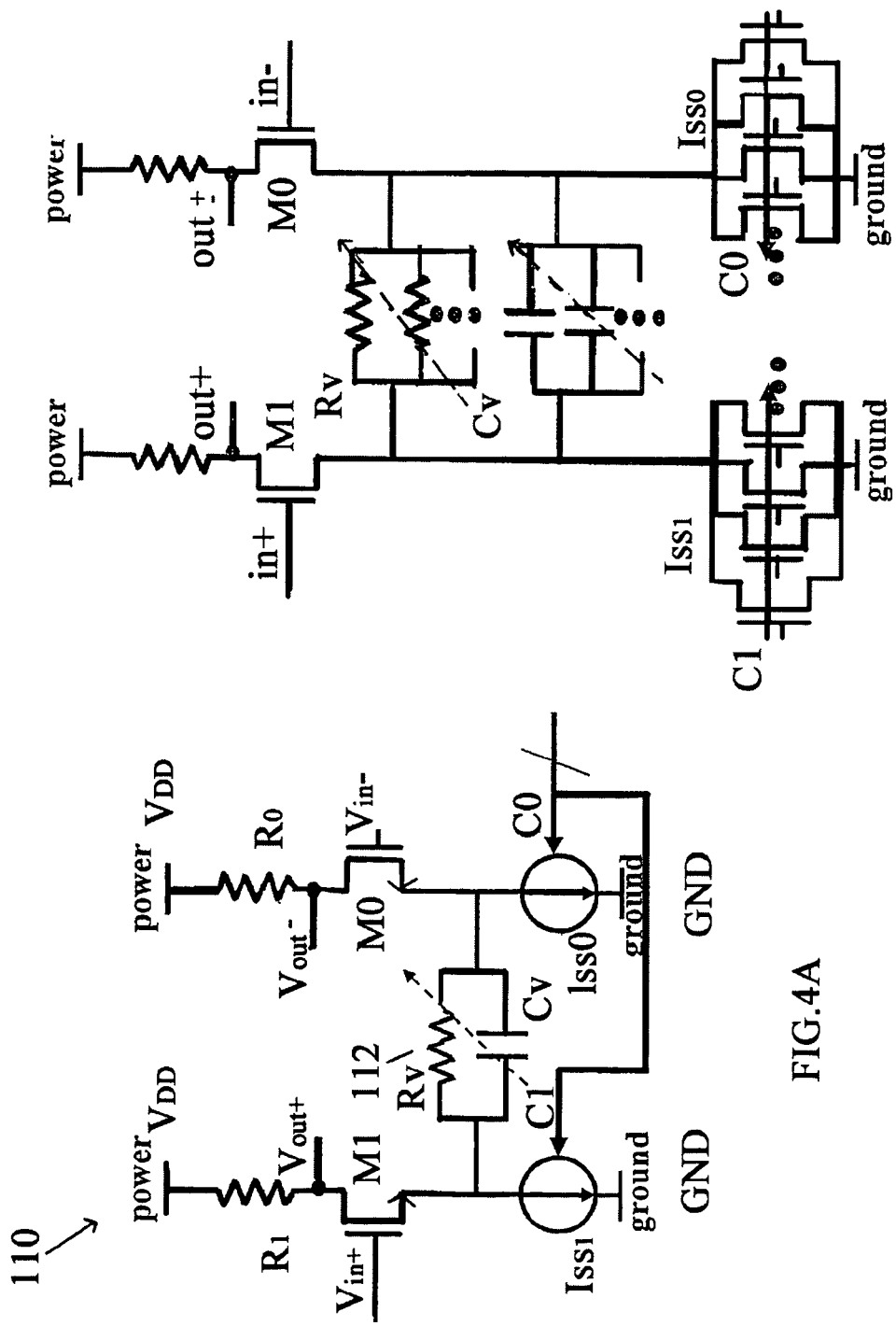
FIG. 4A illustrates the schematic diagram of a source degeneration unit in of an illustrative embodiment.
FIG. 4C illustrates a detailed schematic diagram of the source degeneration unit illustrated in FIG. 4A.
Figure 4B:
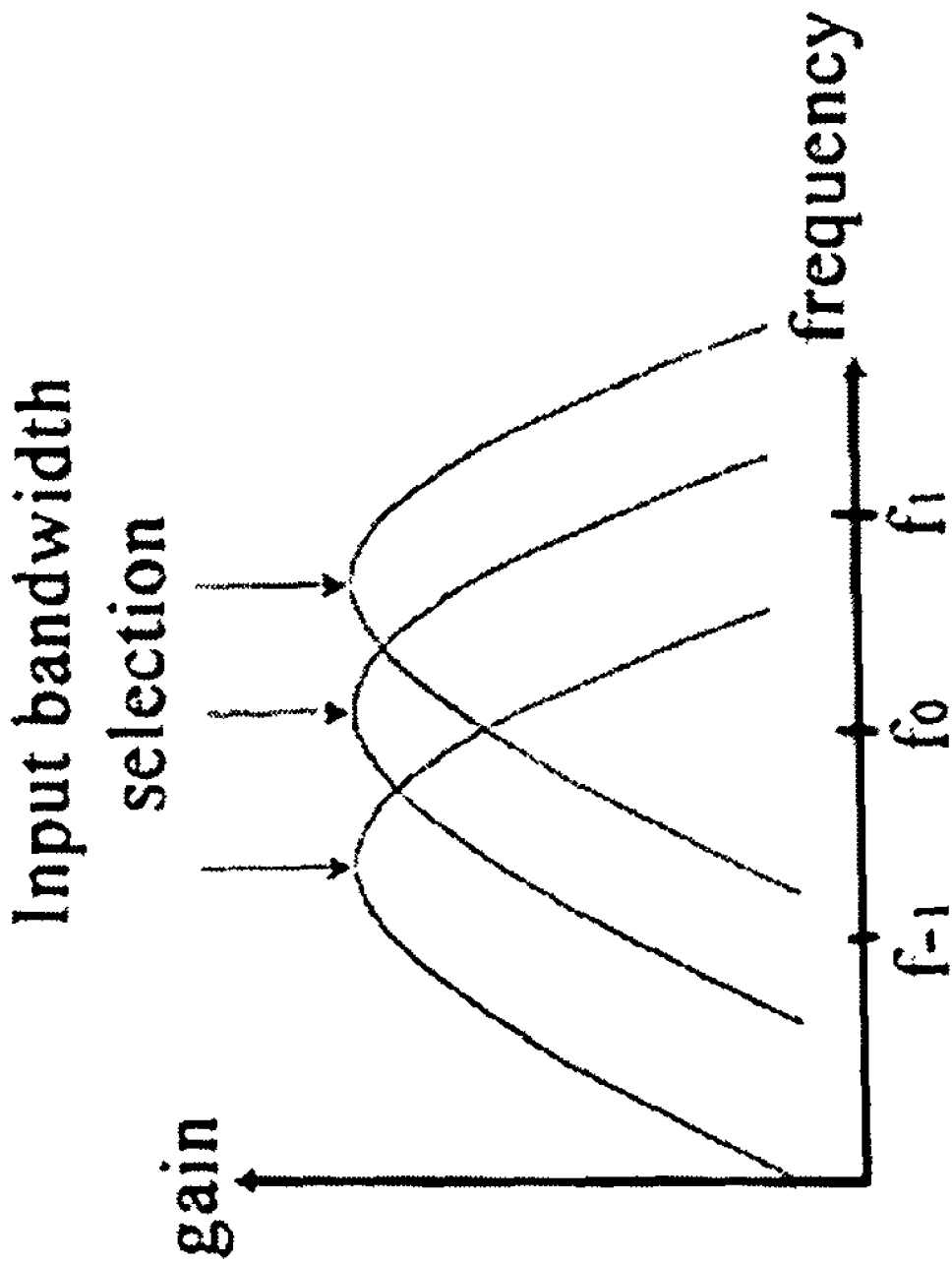
FIG. 4B is a graph showing adjustable input signal frequency bandwidth of an illustrative embodiment.

FIG. 4A illustrates a detailed schematic diagram of source degeneration unit 110 in one preferred embodiment. Source degeneration unit 110 comprises a differential pair. A first branch of the differential pair comprises resistance R0 coupled between supply voltage $V_{DD}$ and the drain of NMOSFET M0. A digitally-controllable current source Iss0 is coupled between the source of NMOSFET M0 and ground GND. A second branch of the differential pair comprises resistance R1 coupled between supply voltage $V_{DD}$ and the drain of NMOSFET M1. A digitally-controllable current source Iss1 is coupled between the source of NMOSFET M1 and ground GND. A variable RC network 112 is implemented in parallel between the sources of M0 and M1. Through varying the resistance and capacitance of resistor Rv and capacitor Cv, respectively, RC network 112 enables a dynamic adjustment of the input signal frequency bandwidth, thus facilitating selecting digital signals of interests from incoming signals in a broad frequency range. As an example, FIG. 4B shows a graph of signal unit gain vs. incoming signal frequency, where the frequency band with a unit gain frequency $f_0$ corresponds to RC network 112 with an original Rv and Cv setting. By adjusting Rv and Cv of RC network 112, the frequency band may be shifted into a higher frequency range with a unit gain frequency $f_1$, for example, or down to a lower frequency range with a unit gain frequency $f_{-1}$, as shown.

Also inputted to source degeneration unit 110 are digital control signal C0 supplied to current source Iss0 and digital control signal C1 supplied to current source Iss1. C0 and C1 are outputted from envelope level adjustment and selection unit 150 and may each comprise multiple-bit digital buses to provide real-time control of the current in current source Iss0 and Iss1 with the actual bus width dependent upon the desired control precision. Current sources Iss0 and Iss1 under the control of digital control signals C0 and C1 may facilitate the dynamic adjustment of an envelope level as described above.

In operation, input differential signals Vin+ and Vin− are supplied to the gate electrodes of M1 and M0, respectively. The amplified output signals Vout+ and Vout− are each provided by the node between R1 and M1, and the node between R0 and M0, respectively.

FIG. 4C illustrates source degeneration unit 110 with further detail of variable resistor Rv and variable capacitor Cv. Rv and Cv each comprises plural variable resistors or capacitors in parallel between the sources of M0 and M1, thus facilitating fine-tuning of RC network 112. Current sources Iss0 and Iss1 are each implemented with four NMOSFETs in parallel between the source of NMOSFET M0 and ground, and the source of NMOSFET M1 and ground, respectively. Control signals C0 and C1 each comprises a four-bit digital bus with each bit coupled to the gate electrode of one of the four NMOSFETs in current sources Iss0 and Iss1, respectively.

Figures 4D, 4E:
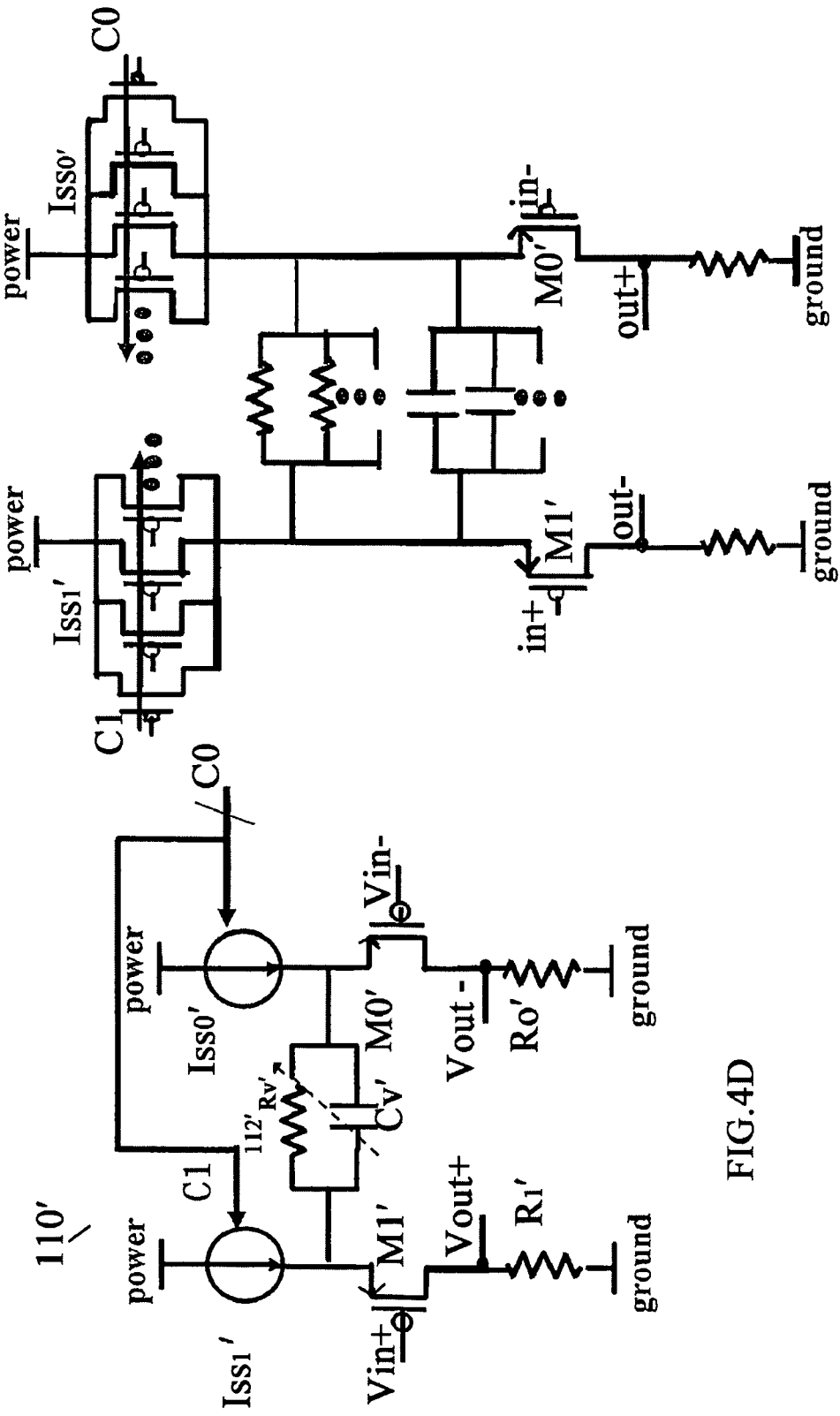
FIGS. 4D-4E illustrate the schematic diagram of a source degeneration unit of an illustrative embodiment.

FIG. 4D illustrates a detailed schematic diagram of source degeneration unit 110' implemented in another preferred embodiment of the current invention. The configuration of 110' is similar to 110 illustrated in FIG. 4A in that 110' also comprises a differential pair, but is different in the following. In a first branch of the differential pair, digitally-controllable current source Iss0' is implemented between the supply voltage $V_{DD}$ and the source of PMOSFET M0.' Resistance R0' is implemented between the drain of PMOSFET M0' and ground GND. Similarly, a second branch of the differential pair comprises digitally-controllable current source Iss1' implemented between the supply voltage $V_{DD}$ and the source of PMOSFET M1,' and resistance R1' implemented between the drain of PMOSFET M1' and ground GND. Variable RC network 112' comprising Rv' and Cv' is implemented in parallel between the sources of M0' and M1.' Digital control signals C0 and C1 from envelope level adjustment and selection unit 150 are supplied to current sources Iss0' and Iss1,' respectively. Input differential signals Vin+ and Vin− are supplied to the gate electrode of M1' and M0,' respectively. The amplified output signals Vout+ and Vout− are each provided to the node between R1' and M1', and the node between R0' and M0', respectively.

FIG. 4E illustrates source degeneration unit 110' described with respect to FIG. 4D with further detail of variable resistor Rv' and variable capacitor Cv.' Rv' and Cv' each comprises plural variable resistors or capacitors in parallel between the sources of M0' and M1', thus facilitating fine-tuning of RC network 112'. Current sources Iss0' and Iss1' are each implemented with four PMOSFETs in parallel between the supply voltage $V_{DD}$ and the source of PMOSFET M0', and between the supply voltage $V_{DD}$ and the source of PMOSFET M1', respectively. Control signals C0 and C1 each comprises a four-bit digital bus with each bit coupled to the gate electrode of one of the four PMOSFETs in current sources Iss0' and Iss1', respectively.

Figures 5A, 5C:
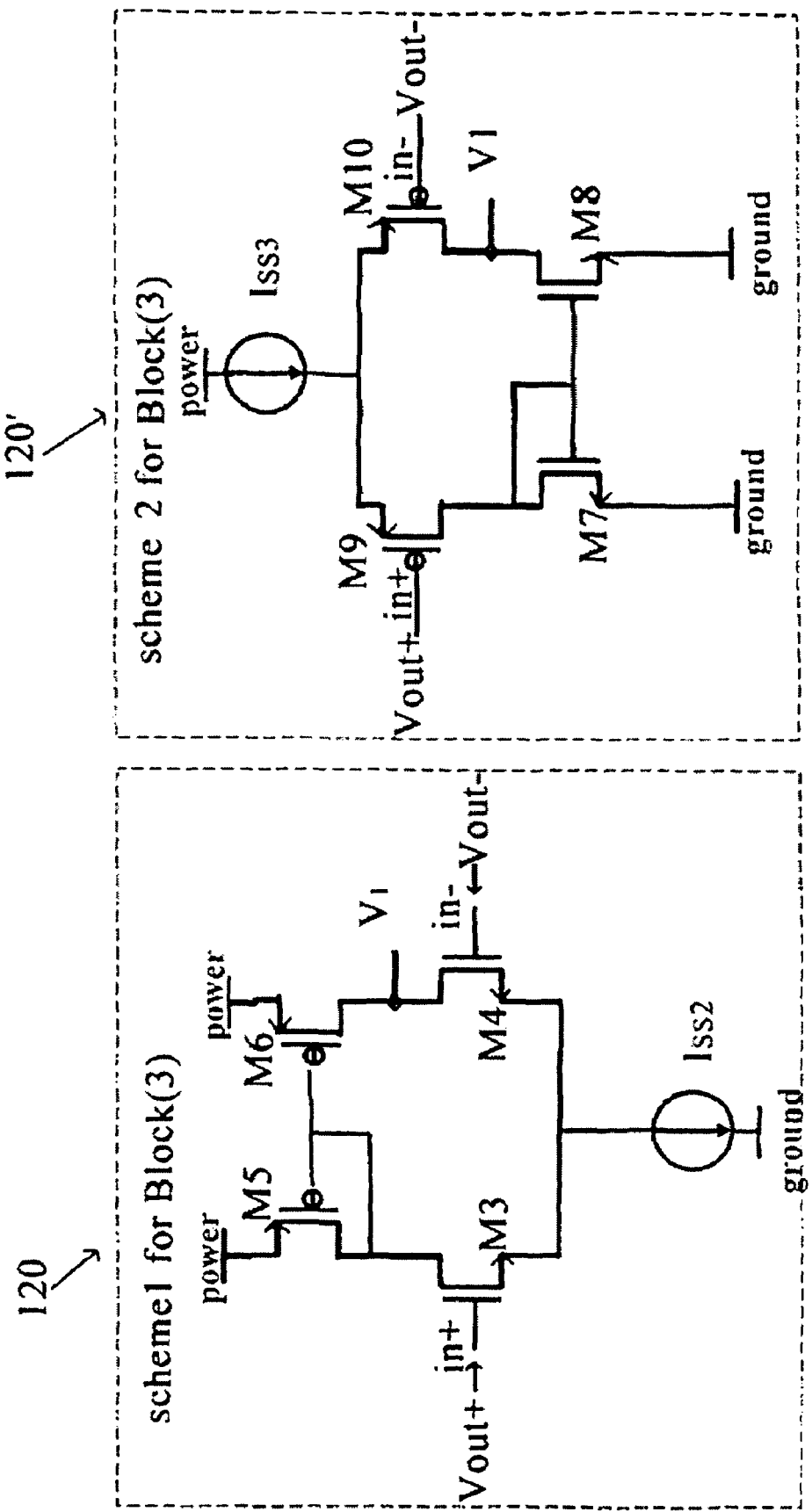
FIG. 5A illustrates the schematic diagram of a differential gain stage of an illustrative embodiment.
FIG. 5C illustrates the schematic diagram of a differential gain stage of an illustrative embodiment.

Next, output signals Vout+ and Vout− from source degeneration unit 110 are provided to differential gain stage 120. FIG. 5A shows a detailed schematic diagram of differential gain stage 120 in one preferred embodiment, which comprises a pair of NMOSFETs M3 and M4, a pair of PMOSFETs M5 and M6, and current source Iss2. The sources of M3 and M4 are connected to one terminal of current source Iss2. The other terminal of current source Iss2 is connected to ground GND. The drains of M3 and M4 are connected to the drains of M5 and M6, respectively. The gate and the drain of M5, and the gate of M6 are tied together. The sources of M5 and M6 are connected to supply voltage $V_{DD}$. Vout+ and Vout− from source degeneration unit 110 are supplied to the gate electrode of M3 and M4, respectively, as input signals of differential gain stage 120. The input differential signals Vout+ and Vout− are converted by differential gain stage 120 to the single-end amplified signal V1, and outputted on the node between the drains of M4 and M6, as shown.

Figure 5B:
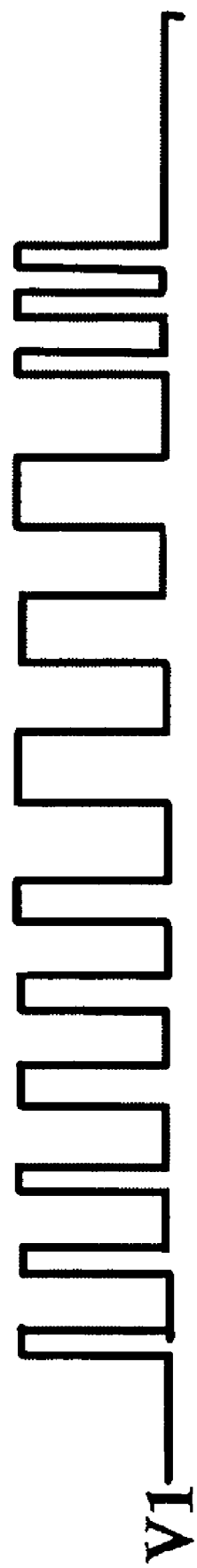
FIG. 5B illustrates a signal waveform outputted by a differential gain stage of an illustrative embodiment.

FIG. 5B shows the waveform of the outputted signal V1 from differential gain stage 120.

FIG. 5C illustrates a schematic diagram of differential gain stage 120' implemented in another preferred embodiment of the current invention, which comprises a pair of NMOSFETs M7 and M8, a pair of PMOSFETs M9 and M10, and current source Iss3. Current source Iss3 is implemented between power supply $V_{DD}$ and the sources of M9 and M10. The sources of M7 and M8 are connected to ground GND. The drains of M7 and M8 are connected to the drains of M9 and M10, respectively. The gate and the drain of M7, and the gate of M8 are tied together. Vout+ and Vout− from source degeneration unit 110 are supplied to the gate electrode of M9 and M10, respectively, as input signals of differential gain stage 120'. The input differential signals Vout+ and Vout− are converted to the single-end amplified signal V1, and outputted on the node between the drains of M8 and M10, as shown.

Figures 6A, 6C:
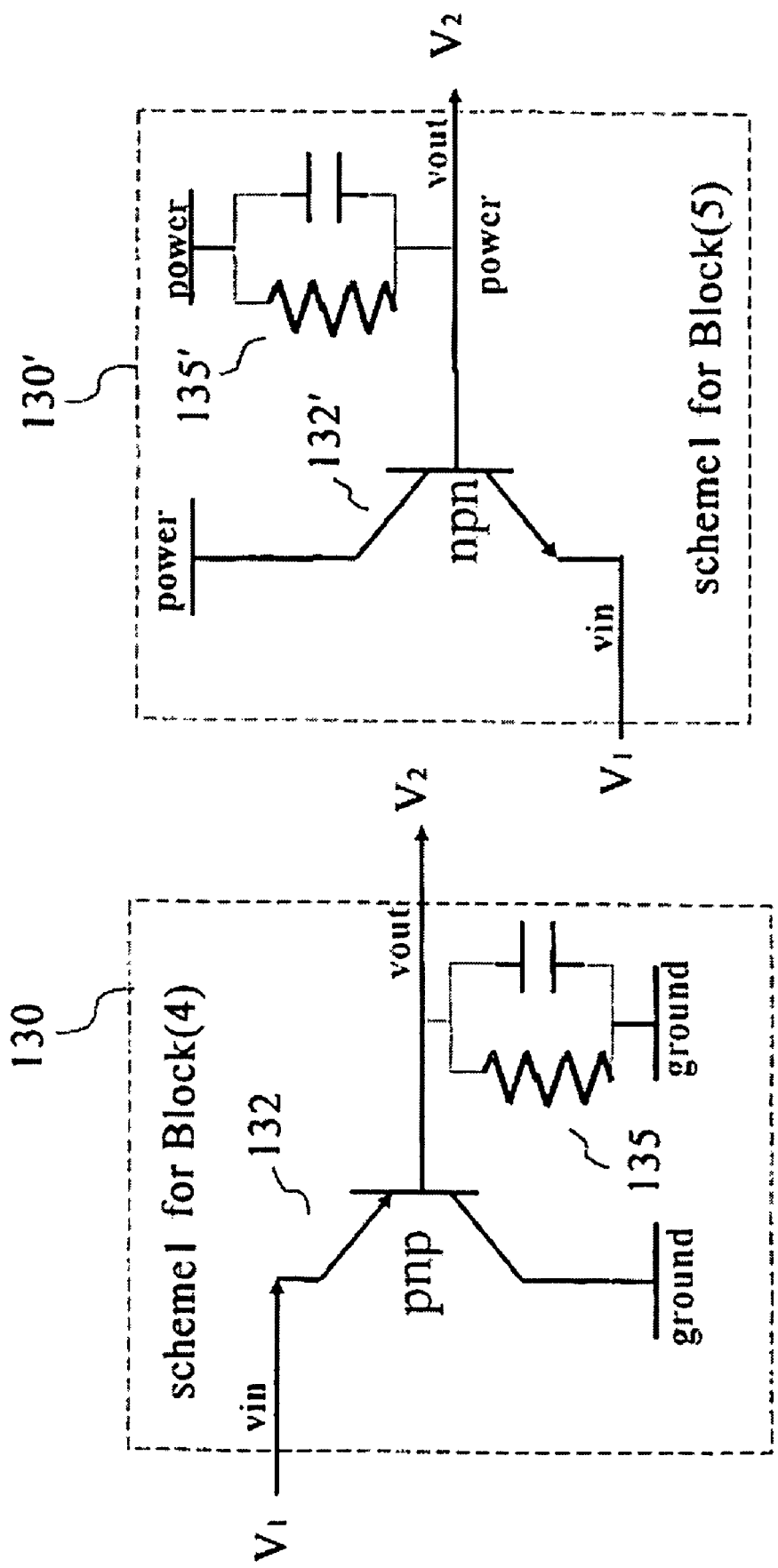
FIG. 6A illustrates the schematic diagram of a potential holding circuit of an illustrative embodiment.
FIG. 6C illustrates the schematic diagram of a potential holding circuit of an illustrative embodiment.

FIG. 6A illustrates a detailed schematic diagram of potential hold circuit 130 in one preferred embodiment. Potential hold circuit 130 comprises PNP bipolar transistor 132 with the collector connected to ground GND. An RC network 135 is implemented between the base of bipolar transistor 132 and GND. Amplified signal V1 outputted from differential gain stage 120 is supplied to the emitter of bipolar transistor 132. As the amplified signal V1 rises, RC network 135 is charged and the potential V2 on the base of PNP bipolar transistor 132 sharply rises. However, when the amplified signal V1 falls, the PN junction between the base and the collector of transistor 132 is reverse-biased and PNP bipolar transistor 132 falls into the cutoff operational region. Due to the absence of an effective discharge path, the potential V2 on the base of PNP transistor 132 is held for a certain period of time. Potential V2 is brought to an increased level when the next rising edge of signal V1 arrives and again charges RC network 135.

Figure 6B:
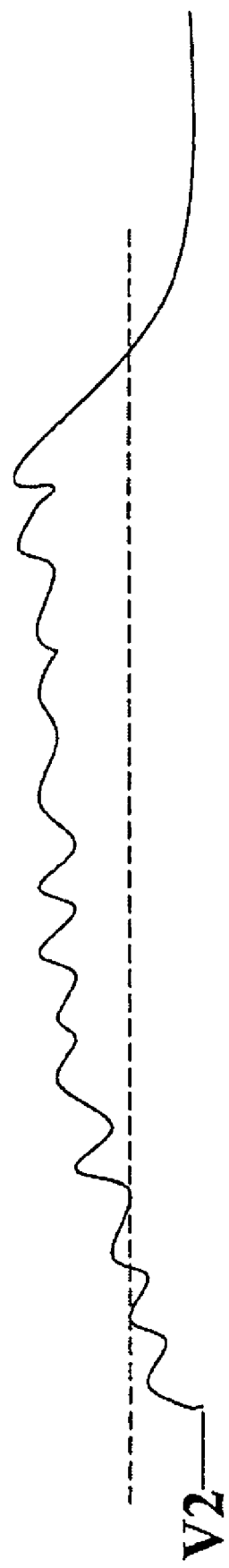
FIG. 6B illustrates a signal waveform outputted by a potential holding circuit of an illustrative embodiment.

FIG. 6B shows the output potential V2 provided from the potential hold circuit 130 upon the input of the amplified signal V1. Output potential V2 increases incrementally with the rising edges of the incoming amplified signal V1, and remains at a peak value while the incoming stream of digital signal V1 continues. The charge held in RC network 135 can be gradually released through bipolar transistor 132 after an incoming digital signal V1 stream passes through. Therefore, potential V2 decreases at a certain rate in the waveform, as shown. It is noted that RC network 135 is charged only during the positive bit time cycle of the incoming signal V1, as described above. Therefore, potential hold circuit 130 of the current embodiment reduces power consumption.

FIG. 6C illustrates a detailed schematic diagram of potential hold circuit 130' in another preferred embodiment. Potential hold circuit 130' comprises NPN bipolar transistor 132' with the collector connected to power supply $V_{DD}$. An RC network 135' is implemented between the base of bipolar transistor 132' and $V_{DD}$. Amplified signal V1 outputted from differential gain stage 120 is supplied to the emitter of bipolar transistor 132. Potential hold circuit 130' operates in a manner similar to potential hold circuit 130 described above with respect to FIG. 6A. RC network 135' is charged during the positive bit time cycle of the incoming signal V1, and the charged potential is held during the negative bit time cycle of the incoming signal V1. The potential V2 on the base of PNP bipolar transistor 132' rises incrementally and remains at a peak value while the incoming stream of digital signal V1 proceeds. The charge held in RC network 135' can be gradually released through bipolar transistor 132' after an incoming digital signal V1 stream passes through.

Figure 7C:
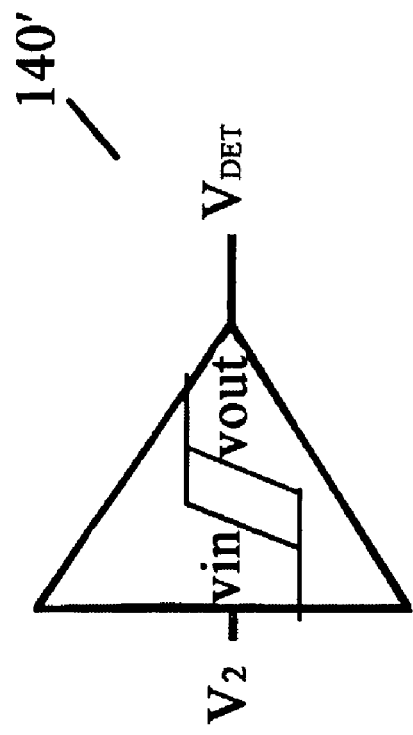
FIG. 7C illustrates the schematic diagram of a comparator circuit of an illustrative embodiment.
Figure 7A:
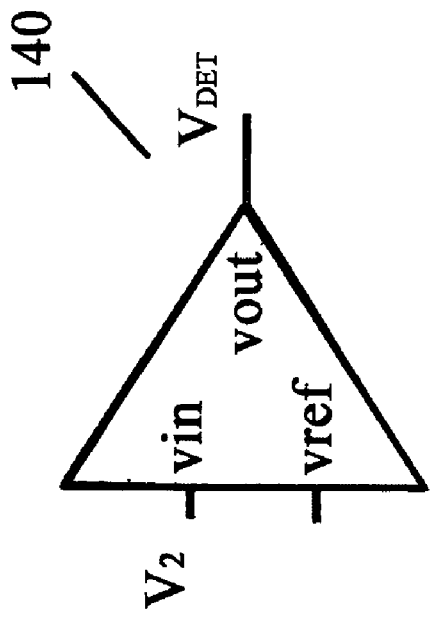
FIG. 7A illustrates the schematic diagram of a comparator circuit of an illustrative embodiment.
Figure 7B:
FIG. 7B illustrates a signal waveform outputted by a comparator circuit of an illustrative embodiment.

FIG. 7A illustrates a detailed schematic diagram of comparator circuit 140 in one preferred embodiment. Comparator circuit 140 comprises an operational amplifier that receives the potential V2 held by the potential holding circuit 130 and a reference potential Vref supplied from a constant voltage source. In comparator circuit 140, reference potential Vref is preferably in the range of 0.3~0.6 times $V_{DD}$. Potential V2 held by the potential holding circuit 130 is inputted to the plus side of the operational amplifier and the reference potential Vref is supplied to the minus side of the operational amplifier. Comparator circuit 140 compares potential V2 with the reference potential Vref. The operational amplifier indicates a high state when potential V2 is larger than the reference potential Vref and indicates a low state when it is smaller then the reference potential Vref. Then the operational amplifier outputs a rectangular-wave detect signal $V_{DET}$ as shown in FIG. 7B.

FIG. 7C illustrates a schematic diagram of comparator circuit 140' in another preferred embodiment. Comparator circuit 140' comprises a Schmitt trigger circuit that receives the potential V2 held by the potential holding circuit 130 and outputs a rectangular-wave detect signal $V_{DET}$ upon comparing V2 with a pre-configured triggering voltage. This comparator configuration may be adopted where the supply voltage $V_{DD}$ is larger than 1.8 V.

As described earlier, the single bit high/low detect signal Vdet outputted from comparator circuit 140 is fed back into envelope level adjustment and selection unit 150.

Figures 8A, 8B:
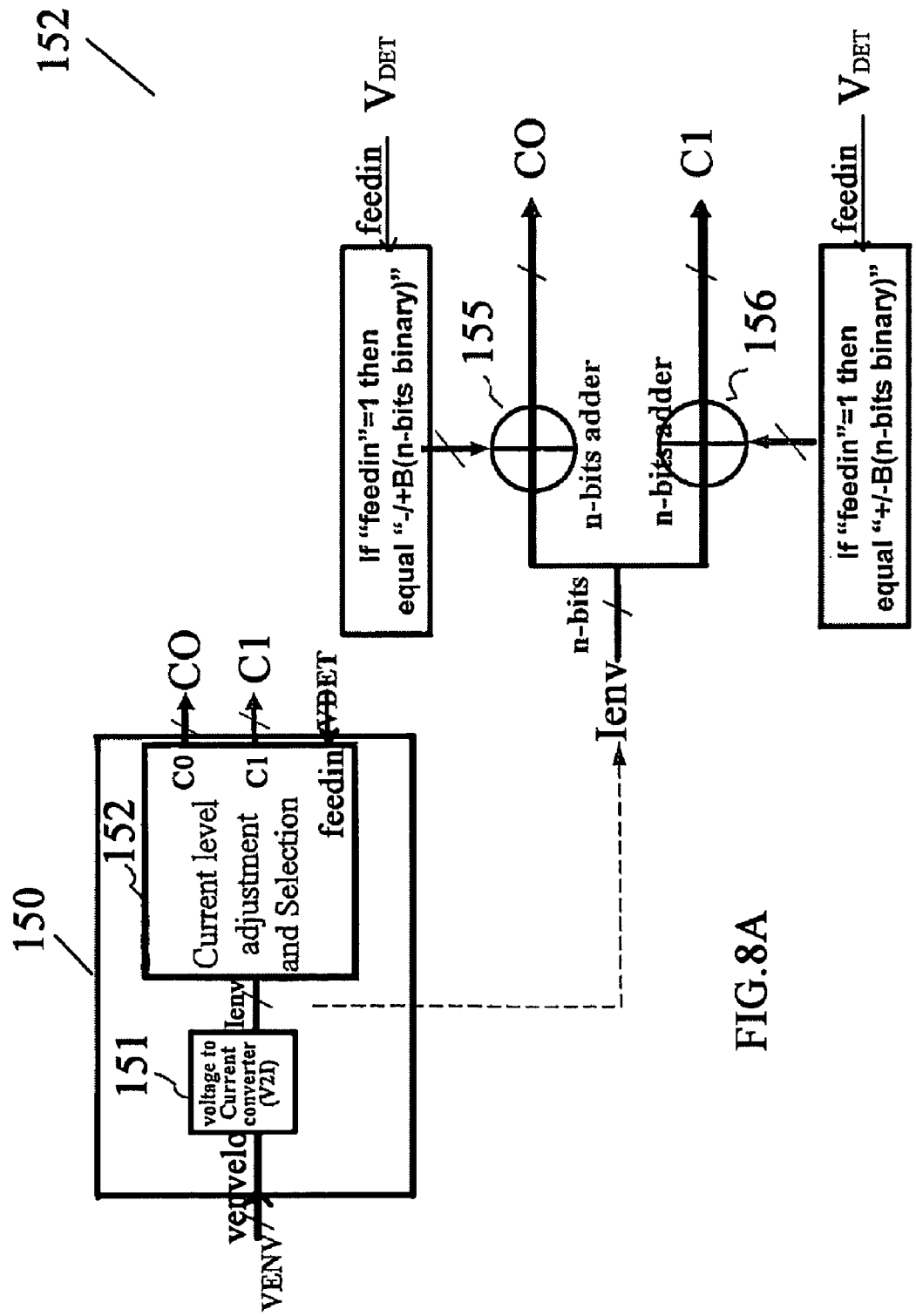
FIG. 8A illustrates a schematic diagram of an envelope level adjustment and selection unit of an illustrative embodiment.
FIGS. 8B-8C illustrates a schematic diagram of a current level adjustment and selection unit of an illustrative embodiment.

FIG. 8A illustrates a schematic diagram of envelope level adjustment and selection unit 150 in one preferred embodiment. Unit 150 comprises a voltage-to-current converting unit 151 and a current level adjustment and selection unit 152. A pre-set system initial selection and offset calibration signal (envelope level signal) Venv is first converted by unit 151 to a current signal Ienv. Current level adjustment and selection unit 152 operates on Ienv and Vdet fed back from comparator circuit 140, and outputs control signals C0 and C1, which are supplied to source degeneration unit 110. Signals Venv, Ienv, C0, and C1 may each comprise an n-bit digital bus to achieve a desired control precision.

Figure 8C:
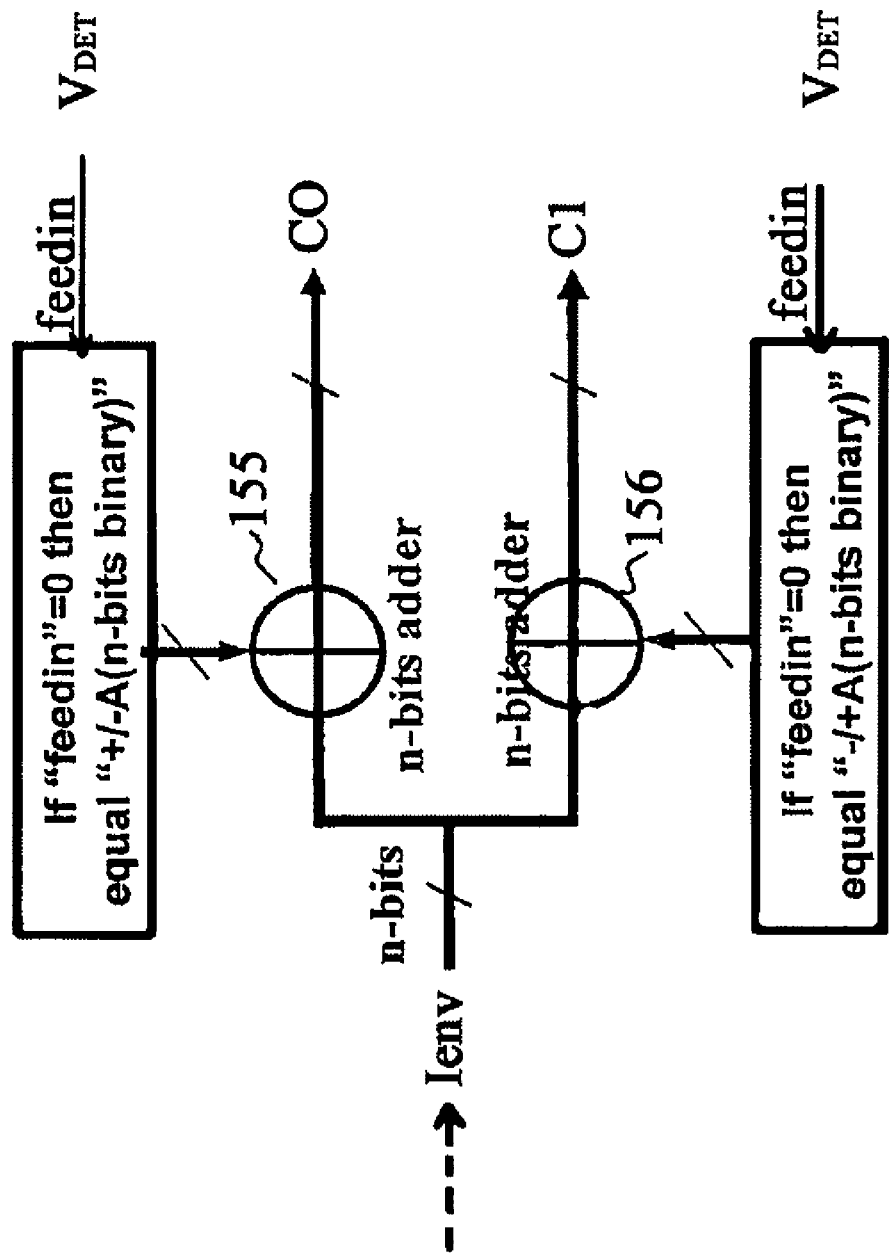

FIG. 8B illustrates a further detailed schematic diagram of current level adjustment and selection unit 152. When a signal is detected (Vdet is high), a pre-set binary value "B" is subtracted from the initial selection and offset calibration current signal Ienv via an n-bit adder 155. In a similar manner, pre-set binary value "B" is added to the initial selection and offset calibration current signal Ienv via an n-bit adder 156. As a result, C0 will increase and C1 will decrease so that the offset value between Vout+ and Vout- outputted from source degeneration unit 110 is decreased. FIG. 8C illustrates that, when non-signal is detected (Vdet is low), a pre-set binary value "A" is added to the initial selection and offset calibration current signal Ienv in n-bit adder 155; and the pre-set binary value "A" is subtracted from the initial selection and offset calibration current signal Ienv in n-bit adder 156. This operation causes C1 to increase and C0 to decrease so that the offset value between Vout+ and Vout- is increased to a value substantially equal to the pre-determined system initial selection and offset calibration signal Venv. As a result, envelope level adjustment and selection unit 150, provided in the feed back loop between the output rectangular-wave detect signal $V_{DET}$ and source degeneration unit 110, enables the dynamic adjustment of the envelope level.

Although the present invention and its advantages have been described in detail, it should be understood that various changes, substitutions and alterations can be made herein without departing from the spirit and scope of the invention as defined by the appended claims. As an example, the inventive feature involving a envelope level adjustment and selection unit 150 and source degeneration unit 110 control signals C0 and C1 in the preferred embodiments may be implemented with other suitable circuit configurations. As another example, it will be readily understood by those skilled in the art that materials, process steps, process parameters in forming the preferred embodiments may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An envelope detecting circuit comprising:
   a source degeneration circuit that amplifies differential input signals to output an amplified signal;
   a gain stage that receives the amplified signal and supplies a voltage proportional to the amplified signal;
   a potential holding circuit that holds the voltage supplied from the gain stage;
   a comparator circuit that compares the voltage held by the potential holding circuit and a reference potential to output a detect signal; and
   an envelope level adjustment and selection unit that operates on the detect signal and outputs a control signal to the source degeneration circuit to control a level of the envelope.

2. The envelope detecting circuit of claim 1, wherein the source degeneration circuit comprises a differential operational amplifier that amplifies the differential input signals to output differential amplified signals.

3. The envelope detecting circuit of claim 1, wherein the gain stage comprises an operational amplifier that amplifies the differential amplified signals from the source degeneration circuit and outputs a single-end amplified signal.

4. The envelope detecting circuit of claim 1, wherein the potential holding circuit comprises:
   a PNP bipolar transistor that receives the single-end amplified signal at its emitter electrode and has its collector electrode connected to the ground (GND); and an RC network with one terminal connected to the GND and the other terminal connected to a base electrode of the PNP bipolar transistor.

5. The envelope detecting circuit of claim 1, wherein the comparator circuit comprises an operational amplifier that receives the potential held by the potential holding circuit and a Vref reference potential supplied from a constant voltage source, and outputs the detect signal.

6. The envelope detecting circuit of claim 1, wherein the comparator circuit comprises a Schmitt trigger circuit that receives the potential held by the potential holding circuit and outputs the detect signal.

7. The envelope detecting circuit of claim 1, wherein the envelope level adjustment and selection unit comprises a voltage-to-current converter that converts an envelope level signal into a current signal, and a current level adjustment and selection unit that responds to the current signal and the detect signal, and outputs the control signal to the source degeneration circuit.

8. An envelope detecting circuit comprising:
a first differential operational amplifier that amplifies differential input signals to output an amplified signal;
a second differential operational amplifier that supplies a single-end voltage proportional to the amplified signal;
a potential holding circuit that holds the voltage supplied from the second differential operational amplifier;
a comparator circuit that compares the voltage held by the potential holding circuit and a reference potential to output a detect signal; and
an envelope level adjustment and selection unit that operates on the detect signal and outputs a control signal to the first differential operational amplifier; wherein the control signal provides dynamic envelope level control.

9. The first differential operational amplifier of claim 8, further comprising a first branch that comprises a first resistor connected to the power supply, a first current source connected to the GND, and a first NMOS transistor connected between the first resistor and the first current source, and a second branch that comprises a second resistor connected to the power supply, a second current source connected to the GND, and a second NMOS transistor connected between the first resistor and the first current source.

10. The first differential operational amplifier of claim 9, further comprising a variable RC network implemented in parallel between the source of the first NMOS transistor and the source of the second NMOS transistor, wherein a input signal bandwidth of the first differential operational amplifier varies in response to resistance and capacitance values of the variable RC network.

11. The envelope detecting circuit of claim 8, wherein the potential holding circuit comprises:
an NPN bipolar transistor that receives the single-end amplified signal at its emitter electrode and has its collector electrode connected to the power supply; and
an RC network in parallel with one terminal connected to the power supply and the other terminal connected to a base electrode of the NPN bipolar transistor.

12. The envelope detecting circuit of claim 8, wherein the comparator circuit comprises an operational amplifier that receives the voltage held by the potential holding circuit and a Vref reference potential supplied from a constant voltage source, and outputs the detect signal.

13. The envelope detecting circuit of claim 8, wherein the comparator circuit comprises a Schmitt trigger circuit that receives the voltage held by the potential holding circuit and outputs the detect signal.

14. The envelope detecting circuit of claim 8, wherein the envelope level adjustment and selection unit comprises a voltage-to-current converter that converts an envelope level signal into a current signal, and a current level adjustment and selection unit that responds to the current signal and the detect signal, and outputs the control signal to the first differential operational amplifier.

15. The control signal of claim 8 further comprises a first digital signal that increases when the detect signal is high, and a second digital signal that increases when the detect signal is low.

16. The first and the second digital signals of claim 15 each comprises an 8-bit digital bus.

17. An envelope detecting circuit comprising:
a source degeneration circuit that amplifies differential input signals to output differential output signals;
a gain stage that amplifies the output differential output signals from the source degeneration circuit and outputs a single-end amplified signal;
a potential holding circuit that holds the potential of the single-end amplified signal supplied from the gain stage;
a comparator circuit that receives the potential held by the potential holding circuit and compares the potential held by the potential holding circuit with a reference potential, and outputs a detect signal; and
an envelope level adjustment and selection unit that operates on the detect signal and an initial selection and offset calibration signal from a constant voltage, and outputs a control signal to the source degeneration circuit to control a level of the envelope.

18. The envelope level adjustment and selection unit of claim 17, wherein the potential holding circuit comprises:
a PNP bipolar transistor that receives the single-end amplified signal at its emitter electrode and have its collector electrode connected to the ground (GND); and
an RC network with one terminal connected to the GND and the other terminal connected to a base electrode of the PNP bipolar transistor.

19. The envelope level adjustment and selection unit of claim 17, wherein the envelope level adjustment and selection unit comprises a voltage-to-current converter that converts an envelope level signal into a current signal, and a current level adjustment and selection unit that responds to the current signal and the detect signal, and outputs a first and a second control signal to a first and a second digitally-controllable current sources, respectively.

20. The envelope level adjustment and selection unit of 19, wherein the envelope level signal, the current signal, the first control signal, and the second control signal are each multiple-bit digital signals.

* * * * *